United States Patent [19]
Jacobsen

[11] 4,440,260
[45] Apr. 3, 1984

[54] BASS-REFLEX LOUDSPEAKER SYSTEM

[75] Inventor: Preben Jacobsen, Glyngøre, Denmark

[73] Assignee: Jamo Hi-Fi A/S, Glyngøre, Denmark

[21] Appl. No.: 432,936

[22] PCT Filed: Feb. 2, 1982

[86] PCT No.: PCT/DK82/00007

§ 371 Date: Sep. 28, 1982

§ 102(e) Date: Sep. 28, 1982

[87] PCT Pub. No.: WO82/02812

PCT Pub. Date: Aug. 19, 1982

[30] Foreign Application Priority Data

Feb. 3, 1981 [DK] Denmark .............................. 475/81

[51] Int. Cl.[3] .............................................. H05K 5/60

[52] U.S. Cl. .................................. 181/172; 181/156; 179/115.5 ES

[58] Field of Search ............... 181/151, 156, 171, 172, 181/199; 179/1 E, 180, 115.5 PS, 115.5 ES

[56] References Cited

U.S. PATENT DOCUMENTS 1,742,016 12/1929 Staunton ............................ 181/172
3,757,890 9/1973 Dunning ......................... 181/172 X
4,298,087 11/1981 Launay .......................... 181/156 X

FOREIGN PATENT DOCUMENTS 2370400 7/1979 France .
46426 11/1932 Sweden .

*Primary Examiner*—Benjamin R. Fuller
*Attorney, Agent, or Firm*—Cushman, Darby & Cushman

[57] ABSTRACT

In a bass-reflex enclosure or cabinet of the kind in which a loudspeaker unit is mounted in an opening (11) of a front plate (10) and at the end of two coaxially mounted and into the interior of the cabinet extending tubular members (13, 14), so that an annular slot (28) around the speaker unit (16) is provided and in a known manner utilized as a bass-reflex port arranged coaxially with the speaker unit (16), said speaker unit is fixedly mounted on the one end of the inner tube (14) whereas the other outer tube (13) is fixedly mounted to the front plate (10) or forms an integral part therewith. The assembly comprising the inner tube (13) having the speaker unit (16) mounted thereto is suspended to the front plate (10) by means of a number of vibration absorbing rubber blocks (22) which are evenly distributed along the periphery of the speaker. Thereby an acoustically dead front plate (10) is achieved.

2 Claims, 3 Drawing Figures

BASS-REFLEX LOUDSPEAKER SYSTEM

TECHNICAL FIELD

The present invention relates to a bass-reflex loudspeakersystem comprising a cabinet having a front plate which is provided with a substantially circular aperture or hole for the mounting of a bass loudspeaker or woofer and with a bass-reflex port in the shape of an annular slot around said speaker, said bass-reflex port being formed of the intermediate space between a first tubular member fixedly mounted to the front place and a second tubular member mounted inside of and coaxially with said first member.

BACKGROUND ART

For many years there has been made efforts to develop loudspeaker enclosures or cabinets which were in acoustical sense totally dead, also in replaying pieces of music at very high sound levels. After all, the purpose is to achieve a neutral reproduction of the electrical signals conducted to the loudspeaker system without colouring the sound picture due to cabinet resonances or other interfering noise sources. This problem has hitherto been solved in many different ways.

Thus, it is known to manufacture enclosures or cabinets of heavy or thick blockboards and further to brace them by means of strong bars. This is a fairly good but costly method, because wood of this quality is expensive. It is also a known method to manufacture the enclosure or cabinet as a double-walled box of e.g. chip board and then fill out the space between the outer and inner box with sand so that the cabinet obtains a considerable weight. In acoustical sense this is an excellent solution because the cabinet by this measure can be kept absolutely in rest. For such goods, however, which have to be transported over long distances, maybe in more than one stage, and which, moreover, have to be stored in large numbers of specimens, this weight is of a prohibitive nature. The same applies to those constructions of concrete or marble which have been disclosed recently in the litterature.

DISCLOSURE OF INVENTION

According to the present invention a bass-reflex loudspeaker system has bee provided in which the bass loudspeaker or woofer is fixedly secured to said second tubular member in an end directed towards the open and in which said second tubular member in said end is mounted to said front plate by means of vibration absorbing, machanical mounting means for the provision of a substantially vibrationless front board or baffle.

Based on commonly known technique in the art the above mentioned combination of measures now permit the manufacture of loudspeaker systems in cabinets or enclosures which are far more acoustically dead than hitherto and yet retain the thickness of the boards traditionally used for the side walls of the cabinet. Further, that kind of distorsion in the medium frequency and high frequency ranges which is due to the Doppler effect from the low frequency loudspeaker or woofer is also avoided. A thickness reduction of the plates or boards would on the contrary not be permissible as the pressure conditions in the air inside the speaker cabinet do not change by the new mounting of the woofer.

BRIEF DESCRIPTION OF DRAWINGS

For the purpose of illustration of this invention, there is shown in the accompanying drawings, a preferred embodiment thereof. It is to be understood that these drawings are for the purpose of example only and that the invention is not limited thereto. In the drawings.

MODES FOR CARRYING OUT THE INVENTION

Figure 1:
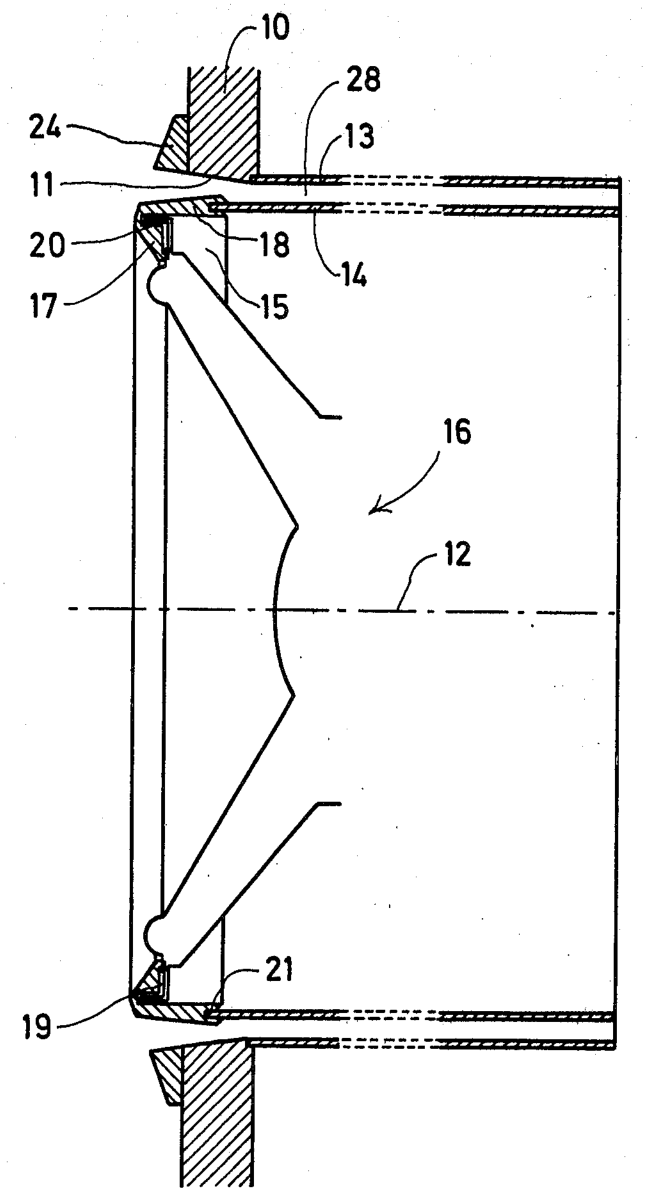
FIG. 1 is a vertical section of the loudspeaker system of the invention which section contains the speaker axis of the woofer and those details which concern the mounting of the speaker indirectly on the front board or plate of the cabinet.

The front plate or board of the loudspeaker enclosure or cabinet is designated by the reference number 10. In the drawings only those details are shown which are related to the special manner in which the woofer is mounted according to the invention because the design of the remaining part of the enclosure is irrelevant of the invention per se. The front plate 10 is provided with a substantially circular opening 11 having a diameter larger than the largest diameter of the speaker to be mounted in said opening. An axis of the opening is designated by the reference number 12. From this opening 11 a first tubular member 13 is protruding an appropriate length into the cabinet. Said first tubular member 13 is secured to the front plate 10 along the edge of the opening 11 and thus forms an integral part of the plate. The tubular member may be of iron which effectively increases the mass of the plate resulting in a reduction of the front plate's vibration sensibility. The necessary stiffness may alternatively be secured by moulding said first tubular member and the front plate in one piece of a suitable plastics material.

Coaxially with said first tubular member 13 there is provided a second tubular member 14 having a smaller diameter than said first member. The second tubular member 14 is at the end which is directed towards the open fastened to a specially profiled inner mounting ring 15 which is also adapted to hold or support a bass speaker or woofer 16 along its periphery.

The profile of the inner mounting ring 15 is to some extent dependent on the design of the edge suspension of the employed speaker unit but it comprises briefly a first flange 17 adapted to be parallel with the front plate 10 and a second flange 18 orthogonally thereto and extending into the cabinet so that the profile of the mounting ring is essentially L-shaped. In the first flange 17 of the mounting ring 15 there are provided grooves 19 to accommodate the edge suspension 20 of the speaker unit 10. In the second flange 18 of the mounting ring there is provided a groove 21 for the accommodation of the edge of said second tubular member 14. The joining of the mounting ring 15 and the edge suspension 30 and the second tubular member 14, respectively may incidentally be carried out in any known manner it either be by glueing, welding or by means of rivets or screws. It should just be ensured that the second tubular member 14 and the mounting ring 15 are mutually immovable. The second tubular member 14 too may suitably be made of iron to increase the total mass of that part of the system to which the speaker unit is attached.

The assembly comprising said second tubular member 14, the mounting ring 15 and the speaker unit 16 is fastened to the front plate 10 in such manner that vibrations originating from movements of the speaker diaphragm or cone as much as possible is prevented from being propagated to said front plate and further to the remaining part of the cabinet.

Figure 2:
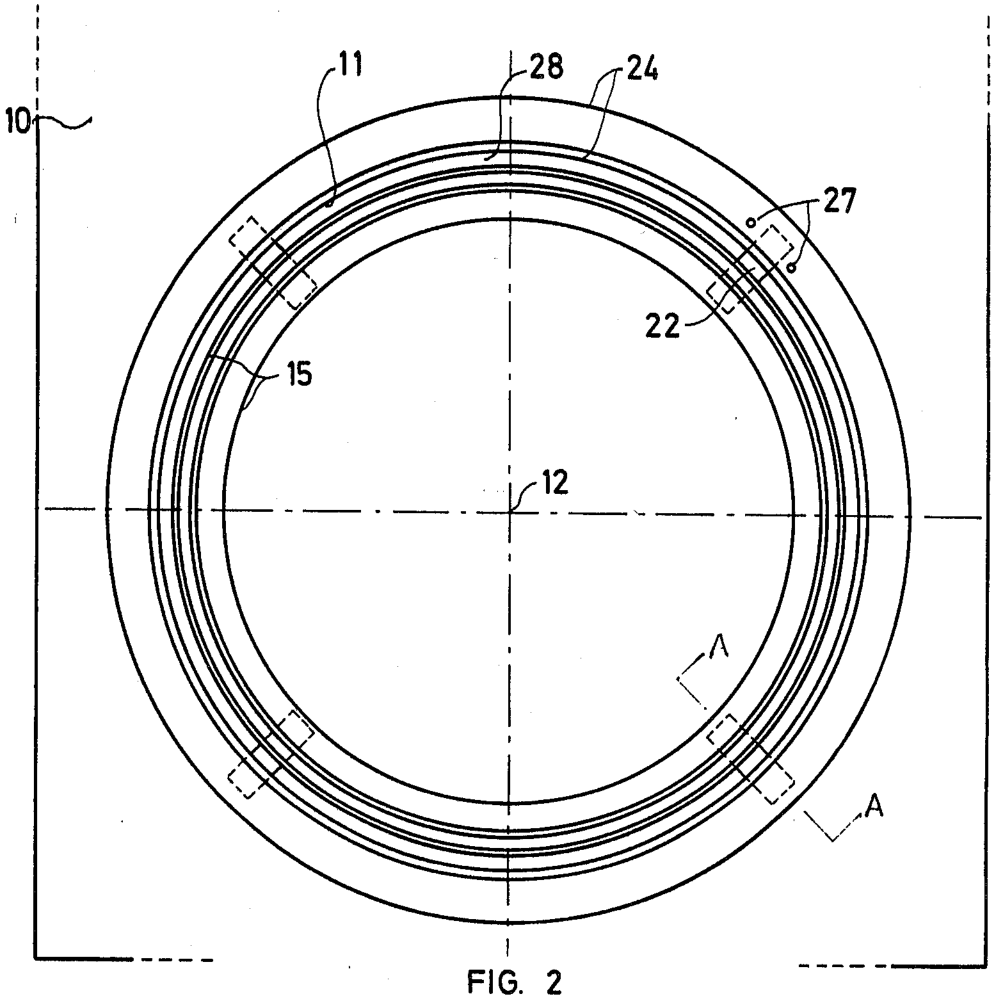
FIG. 2 is a front view of the same as in FIG. 1.
Figure 3:
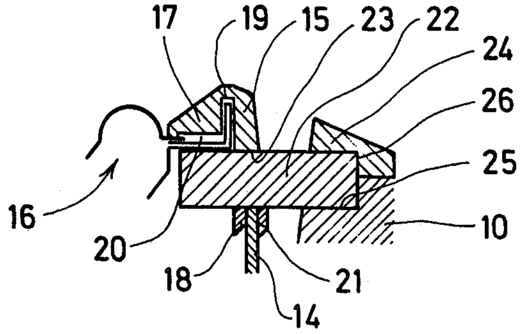
FIG. 3 is a sectional view taken on the line A—A of FIG. 2.

One way of accomplishing this is illustrated in FIGS. 2 and 3. In the example shown there is as vibration-damping fastening or suspending means employed four rubber blocks 22 evenly distributed along the periphery of the speaker unit. Each rubber block 22 is by one of its ends inserted in a recess 23 in the second flange 18 of the mounting ring 15 and prevented from lateral movements, e.g. by means of a glue, and by its opposite end clamped between the front plate 10 and an outer mounting ring 24. In order to accommodate the end of the rubber block in question there is provided appropriate recesses 25 and 26 in the front plate 10 and in the outer mounting ring 24, respectively. The outer mounting ring 24 is secured to the front plate 10 for instance by means of screws. In FIG. 2 there is suggested a mounting screw 27 on either side of the rubber block 22. The number of rubber blocks and the number of screws may, however, be varied in dependance on among others the weight which has to be supported, the width of the space 28 between said first and said second tubular member 13 and 14, respectively, and on the properties of the material selected for the rubber blocks 22. As to the selection of materials, it has proved that natural rubber provides the best vibration damping effect at all but in a series production of the loudspeaker system it implies a better economy when a suitable type of synthetic rubber is employed, because the properties of synthetic rubber, such as its hardness, may be easier determined during an extrusion process than for a natural rubber, the manufacture of which is quite another. Actually, it may prove to be advantageous to utilize rubber having different degrees of hardness adapted to different speaker sizes.

Thus, it is large requirements which is made of these rubber blocks because they have to secure that vibrations stemming from the speaker unit are not transmitted to the front plate and further, they have to secure that the second tubular member 14 remains coaxially aligned with the first tubular member 13 and does not tilt relative thereto. This last mentioned requirement may be accomplished at least to some extent by means of one, maybe more, supporting rubber blocks interposed in the space 28 between the tubular members at their free ends.

It should be noted that the ring-shaped slot between the front plate and the edge of the speaker unit, which slot is created by this special vibration-damping suspension of the woofer 16, is utilized in a known manner as a bass-reflex port or opening 28 defined by the two koaxial tubes 13 and 14, respectively. The provision of yet another hole in the front plate to serve as a bass reflex port is thereby rendered superfluous. In the interior of the cabinet the tubes terminate in the same vertical plane such as indicated in FIG. 1 by a solid line, and their lengths are tuned in accordance to the ratio between the area of the bass reflex port and the volume of the cabinet in accord to commonly known technique in this field.

I claim:

1. A bass-reflex loudspeaker system comprising an enclosure or cabinet having a front plate, which is provided with a substantially circular aperture or hole for the mounting of a bass loudspeaker or woofer and with a bass-reflex port in the shape of an annular slot around said speaker, said bass-reflex port being formed of the intermediate space between a first tubular member fixedly mounted to said front plate and a second tubular member mounted inside of and coaxially with said first member, wherein said bass loudspeaker or woofer (16) is fixedly mounted to said second tubular member (14) in that end which is directed towards the open, and wherein said second tubular member (14) at said end is mounted on the front plate (10) by means of vibration absorbing mechanical mounting means (22) for the provision of an essentially vibrationless front plate.

2. A loudspeaker system as in claim 1, wherein said bass loudspeaker or woofer is fixedly mounted to said second tubular member by means of a first mounting ring, and wherein said front plate includes a second mounting ring, said mechanical mounting means including a plurality of rubber suspension members uniformly distributed around the periphery of said loudspeaker or woofer, said rubber suspension members each being clamped at one end thereof between said second tubular member and said first mounting ring and at the other end thereof between said front plate and said second mounting ring.

* * * * *

UNITED STATES PATENT AND TRADEMARK OFFICE

CERTIFICATE OF CORRECTION

PATENT NO. : 4,440,260

DATED : April 3, 1984

INVENTOR(S) : Preben JACOBSEN

It is certified that error appears in the above-identified patent and that said Letters Patent is hereby corrected as shown below:

In the FOREIGN PATENT DOCUMENTS section change "Sweden" to --Denmark--.

Column 1, line 48 change "bee" to --been--;
line 53 change "machanical" to --mechanical--;
line 56 change "permit" to --permits--.

Signed and Sealed this

*Eleventh* Day of *September 1984*

[SEAL]

*Attest:*

GERALD J. MOSSINGHOFF

*Attesting Officer* *Commissioner of Patents and Trademarks*